United States Patent [19]
Behringer et al.

[11] Patent Number: 4,751,169
[45] Date of Patent: Jun. 14, 1988

[54] METHOD FOR REPAIRING LITHOGRAPHIC TRANSMISSION MASKS

[75] Inventors: Uwe Behringer, Ammerbuch, Fed. Rep. of Germany; Kurt Dätwyler, Richterswil; Peter Vettinger, Langnau/am Albis, both of Switzerland

[73] Assignee: International Business Machines Corporation, Armonk, N.Y.

[21] Appl. No.: 858,327

[22] Filed: May 1, 1986

[30] Foreign Application Priority Data

May 29, 1985 [EP] European Pat. Off. ........ 85106609.2

[51] Int. Cl.$^4$ ............................................... G03C 5/00
[52] U.S. Cl. .................................... 430/296; 430/322; 430/324; 430/325; 430/326; 430/942; 430/967; 430/5; 378/35; 356/237; 250/492.3
[58] Field of Search .................. 430/5, 296, 324, 325, 430/326, 328, 942, 945, 967, 322; 356/394, 237; 250/492.3, 492.22, 492.2, 492.1; 156/643; 378/35; 437/36, 931

[56] References Cited

U.S. PATENT DOCUMENTS 3,748,975 7/1973 Tarabocchia ...................... 430/5 X
4,148,065 4/1979 Nakagawa ........................... 358/101
4,256,778 3/1981 Mizukami et al. ................ 427/10
4,475,037 10/1984 Vettiger et al. .................. 250/252.1

FOREIGN PATENT DOCUMENTS 0036310 3/1981 European Pat. Off. .
0094501 5/1983 European Pat. Off. .
111038A 8/1983 Japan .
58-548A 8/1984 Japan .

OTHER PUBLICATIONS

Thompson et al., Introduction to Microlithography, American Chemical Society, Washington, D.C., 1983, pp. 107–111.
Behringer et al., Method of Producing Defect-Free Transmission Mask, IBM Tech. Disc. Bull., vol. 27(8), Jan. 1985, pp. 4815–4816.
Awamura, D., "Automatic Photomask and Wafer Fault Inspection System," JEE, Dec. 1982, pp. 65–67.
Morgan, W. M., "Microscope Inspection of Photoresists", IBM Tech. Disc. Bull., Jul. 1983, p. 572.

Primary Examiner—John E. Kittle
Assistant Examiner—José G. Dees
Attorney, Agent, or Firm—Jeffrey S. LaBaw; Maurice H. Klitzman; E. Brown

[57] ABSTRACT

The invention concerns a method for repairing transmission masks. After the mask has been inspected and the position coordinates of the mask openings have been stored, these position coordinates are compared with the position coordinates of the desired mask pattern to determine the location of defects. The mask to be repaired is then blanket coated on its front side with a photoresist. Particular photoresist regions overlying the mask defects to be repaired are exposed by non-optical or optical radiation for cross-linking the photoresist, the dose required for cross-linking depending upon the respective resist employed. The non-crosslinked portions of the photoresist are subsequently removed. Gold is then applied to the rear of the mask, with the cross-linked photoresist regions acting as a substrate. After the gold has been applied, the cross-linked photoresist regions are removed, typically by plasma etching. Since, after comparison of the position coordinates of mask defects with stored structural mask data, the exposure system exposes and cross-links only the photoresist regions necessary to correct mask defects, mask correction can be carried out within milliseconds.

14 Claims, 4 Drawing Sheets

METHOD FOR REPAIRING LITHOGRAPHIC TRANSMISSION MASKS

BACKGROUND OF THE INVENTION

1. Field of the Invention

The invention concerns a method for repairing transmission masks for X-ray, electron and ion beam lithography, respectively.

2. Background of the Invention

The continuing trend of VLSI semiconductor technology towards reduced circuit dimensions calls for lithographic processes and exposure systems permitting the printing of submicrometer patterns. Due to the low focussing depth and the scattering of light by the mask edges, previously used photooptical exposure systems are no longer suitable for producing such submicrometer patterns. Therefore, methods have to be adopted using non-optical radiations with much shorter wavelengths than those employed in photooptical systems. Non-optical radiations currently used are X-rays, electron or ion beams.

X-ray, electron or ion beam exposure necessitates transmission masks with submicrometer structures and a high degree of geometrical precision which is essential for overlay printing. In contrast to masks for optical exposure comprising chromium structures on glass substrates, the masks for electron and ion beam lithography are made up of thin silicon or silicon nitride foils or membranes with physical holes in their transparent regions for passing the radiation. They are manufactured photolithographically followed by isotropic and strictly anisotropic etching. During manufacture, dust particles or, even more frequently, the formation of holes in the photoresist to be exposed may lead to additional undesired holes. In addition, lattice defects occurring during the boron doping of the wafers making up the masks may lead to further defect holes during selective etching. Such defect holes are undesirable because they are etched in the same way as the desired structures during the manufacture of the transmission mask, thus falsifying the mask structures. Even optimum clean room conditions fail to completely avoid such additional holes. To remedy this, methods have been developed for repairing transmission masks.

The mask repair process used in photooptical lithography, wherein excessive chromium is removed from the mask structures by a laser beam or defect holes are closed by manually applying photoresist with a small brush, is unsuitable for repairing the above-described transmission masks, since, unlike photooptical masks, the repair process is not performed on samples that have been magnified up to 10 times their natural size but on transmission masks with structures at a 1:1 scale, with the resultant structures being frequently smaller than 0.5 $\mu$m.

IBM Technical Disclosure Bulletin, Vol. 27, No. 8, January 1985, pp. 4815, 4816, describes a method for repairing defective transmission masks, wherein a photoresist layer is applied to the top side of the defective mask and all mask holes, including the defective ones, are closed. The photoresist layer is subsequently exposed through a transmission mask, whose structure is identical to that of the mask to be repaired, taking care that the positions of defect holes, if any, in the exposure mask do not coincide with those in the mask to be repaired. Further defects, resulting from defective regions of the mask used for repair are eliminated by reexposing the photoresist layer on the mask to be repaired through a mask of the same structure as that used in the first exposure step, once again taking care that the positions of the defect hole of the mask used for reexposure do not coincide with those of the previously used mask and the mask to be repaired. This method has the disadvantage that the photoresist remaining on the mask may lead to undesirable charges when the mask is subsequently exposed. In addition, this method provides for repatterning of the entire mask. This described repair process is recommendable when there are many defect holes to be closed. If as a consequence of optimum clean room conditions visual mask inspection reveals only very few defect holes to be closed, it may be more advantageous to use a method permitting the repair of single defect holes. However, known methods for repair of single defect holes take several minutes to repair a single hole so that mask repair time can become intolerable.

It is the object of the present invention to provide a method for repairing transmission masks, which permits all mask patterns to be repaired, regardless of the number of defects, to their desired patterns within an economically acceptable time.

It is another object of the present invention to provide a repaired mask which does not lead to undesirable charge build-up when the mask is subsequently used in lithographic processing.

SUMMARY OF THE INVENTION

In accordance with the present invention, a method is provided for repair of defects in lithographic masks which are used to produce submicron patterns.

After manufacture of the lithographic mask, all patterns, i.e., all openings through the mask, are initially inspected for their desired dimensions. This inspection serves to determine whether the openings are correctly positioned and whether their shape and size comply with the structural mask data. It also serves to determine whether undesired openings, so-called defect holes, inside or outside the actual mask pattern or contaminations, such as dust particles, exist in the opening region. Mask inspection may be effected using an electron raster microscope or an electron beam scanner (vector scanner), or an electron beam projection system and comparing the data of the opening or hole detected by the electron beam with computer-stored data of the mask structure. If, for example, an undesired hole is found in the mask, it must be repaired at the respective position. In the same manner, it is determined by way of comparison with computer data whether dust particles exist inside the mask openings.

After inspection, the mask is removed from the scanner or projection system, and a method similar to that described in IBM Technical Disclosure Bulletin, Vol. 27, No. 8, January 1985, pp. 4815 to 4816, hereby incorporated by reference, isused to close all mask openings and holes with a photoresist layer. The photoresist layer is comprised of a known positive or negative photoresist material.

The position coordinates of the mask pattern defects were obtained and stored in data records during inspection. Using these defect position coordinates, an exposure tool, capable of crosslinking the photoresist material upon exposure, is used to write a pattern in the photoresist layer which corresponds to the size and location of the respective defect hole, in the underlaying mask. Crosslinking of the photoresist material in the exposed areas renders the exposed areas of the photoresist layer, corresponding to the defect holes, insoluble. For positive tone photoresists, it is necessary to subsequently blanket expose the photoresist layer to irradiation rendering it soluble in commonly used developers. For negative tone photoresists, the blanket exposure is not necessary. A commonly available developer is then used to remove the photoresist from any regions not to be repaired (uncrosslinked) photoresist regions.

After all defect holes in the lithographic transmission mask have been closed, gold can be applied, by a method such as vapor-deposition, on the side of the mask opposite the side on which the photoresist layer was applied, with the remaining, crosslinked regions of the photoresist layer acting as a substrate. Although it is possible to repair minor defects without a gold application, gold application is the preferred embodiment. Subsequent to gold deposition, the crosslinked photoresist regions can be removed using an oxygen plasma.

The above-described method is not only suitable for closing undesired defect holes, but may also be used to correct defective desired mask openings, for example, to correct frayed mask openings. In the latter case, the electron beam exposure system writes a pattern into the photoresist layer overlying the defective opening, in which the desired opening is not exposed, but the frayed areas adjacent to the desired opening are exposed. As previously described, the beam dose is chosen such that the exposed photoresist adjacent to the desired, but to be corrected, opening is cross-linked and made insoluble. In the case of positive photoresists, this is followed by blanket exposing and developing the resist, as previously described. In that way, the shape of mask openings may be corrected.

If contaminations, such as dust particles, are to be removed from desired mask openings, a photoresist layer is also blanket-deposited overlaying the opening from which the dust is to be removed. By electron beam exposure of a normal dose, followed by development, the mask openings are reopened. It is also possible to expose in an electron beam exposure system all photoresist regions complementary to those overlying the mask holes to be cleaned. By selecting the beam dose as a function of the photoresist to be exposed, the photoresist in those regions is cross-linked. If a positive photoresist is used, blanket exposure is then effected using non-crosslinking radiation, such as UV light, so that the photoresist regions not exposed to the electron beam are soluble during development. For negative photoresists, this exposure step prior to development is eliminated. From the openings which have been reopened by the above-described method, any undesired dust particles can be subsequently removed by wet or dry etching. The photoresist layer overlying the mask is then removed by etching in an oxygen plasma.

DETAILED DESCRIPTION OF THE INVENTION

Figure 1:
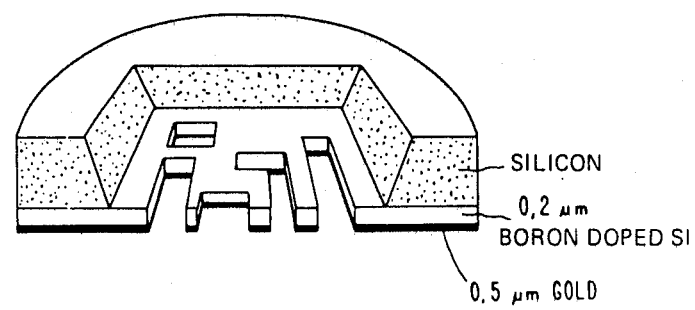
FIG. 1 is a cross-sectional view of an electron beam transmission mask.
Figure 2A:
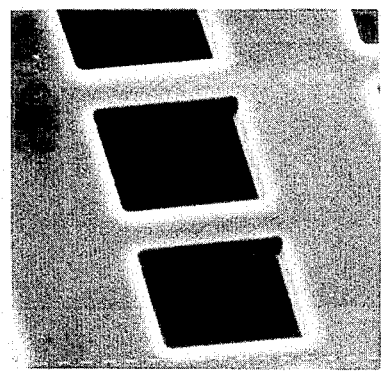
FIG. 2A shows a transmission mask with physical openings.
Figure 2B:
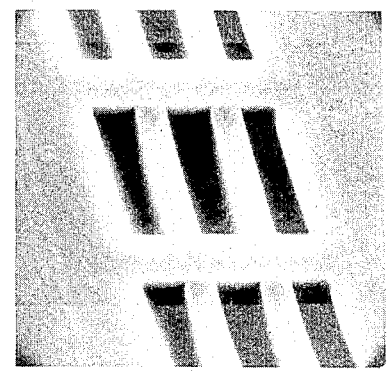
FIG. 2B is a view of the same mask with two strips of cross-linked photoresist.
Figure 3A:
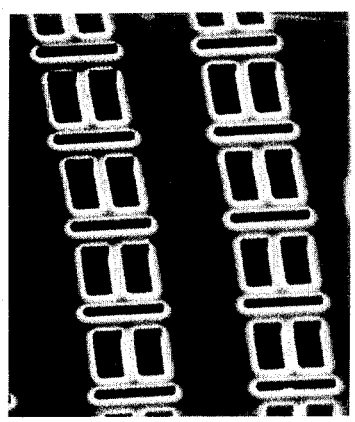
FIG. 3A shows a transmission mask in which all pattern openings are opened.
Figure 3B:
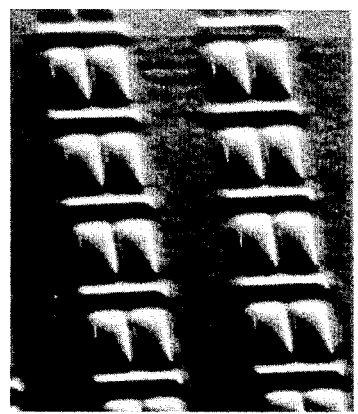
FIG. 3B shows the same mask blanket-coated with photoresist.
Figure 3C:
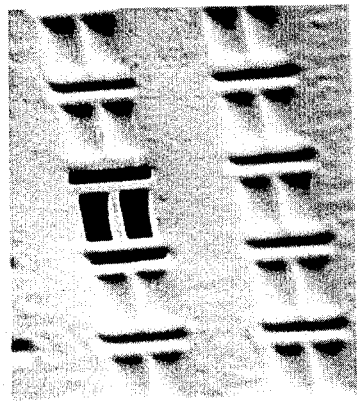
FIG. 3C shows the same mask with an opening containing a dust particle to be removed.
Figure 3D:
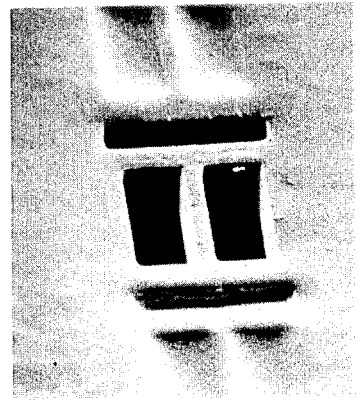
FIG. 3D shows a magnified version of the opening with the dust particle of FIG. 3C.

The electron beam transmission mask of FIG. 1 comprises a monocrystalline boron-doped silicon membrane of about 2 to 3 $\mu$m thickness with a gold layer on its surface, which improves the beam-stopping characteristics. The mask has the size of a silicon wafer and its smallest structures have a width of about $\frac{1}{2}\mu$m. The same mask type can also be used for ion or X-ray lithography.

A typical method of producing a mask for electron beam, ion beam or X-ray lithography is briefly described below. The mask substrate is an about 0.2 to 0.4 mm thick 100 orientation silicon wafer, polished on either side. The back side of the wafer is coated with a silicon dioxide layer. From the front side of the silicon wafer, boron is diffused into the substrate up to a surface concentration of at least $10^{20}$ boron atoms/cm$^3$. The boron diffusion serves as an etch barrier during the subsequent etch step of the silicon wafer, thus determining the mask thickness. Subsequently, several windows of chip size, through which the wafer is etched, are generated on the back of the wafer by conventional photolithography and wet etching. Then a silicon dioxide layer is sputtered onto the boron-doped front side of the wafer. A positive tone photoresist is then deposited on the silicon dioxide layer. The desired mask pattern is obtained by exposing and developing the resist layer. For patterns with submicrometer dimensions, exposure is effected by means of an electron beam scanner (vector scanner). The structured, patterned, resist layer acts as a mask for etching the silicon dioxide layer on the front side of the wafer. The silicon dioxide layer can be structured by reactive ion etching with CF$_4$. After the remaining resist has been stripped, the structured silicon dioxide layer is used as a mask in a second reactive ion etch step to etch an about 2 to 4 $\mu$m deep pattern into the boron-doped silicon. In that step, SF$_6$, Cl$_2$ and a helium mixture can be used. Under selected conditions, silicon dioxide to silicon etch ratios of 1:5 to about 1:20 are obtained. This strictly directional etch process yields almost vertical silicon side walls. For etching silicon, other gas mixtures are equally suitable.

Finally, the wafer substrate is directionally wet etched through the openings in the silicon dioxide layer on the back of the wafer. The monocrystalline boron-doped membrane mask has a thickness of about 2 $\mu$m, depending upon the etching solution used and the concentration of boron atoms used during the boron diffusion step. After the remaining silicon dioxide layers have been removed, the structured silicon membrane is coated with a gold layer of the thickness necessary for decelerating an electron beam of the energy used during subsequent lithography processes.

After manufacture of the mask, all patterns, i.e., all openings, are initially inspected for their desired dimensions. This inspection serves to determine whether the openings are correclty positioned and whether their shape and size comply with the structural mask data. It also serves to determine whether undesired openings, so-called defect holes, inside or outside the actual mask pattern, or contaminations, such as dust particles, exist in the opening regions. Mask inspection may be effected in an electron beam scanner (vector scanner) or an electron beam projection system by comparing the data of the openings detected by the electron beam with computer-stored data of the desired mask structure. If, for example, an undesired hole is found in the mask, it must be repaired at the respective position. In the same manner, it is determined by way of comparison with computer data whether dust particles exist inside the mask openings. After inspection, the mask is removed from the scanner or projection system, and is blanket-coated with a photoresist using a method similar to the method described in IBM Technical Disclosure Bulletin, Vol. 27, No. 8, January 1985, pp. 4815 to 4816, closing all mask openings. For coating, known positive or negative photoresist materials may be used. At this stage, the mask pattern covered with the photoresist can be reopened by reexposing the entire circuit structure. In that case, all openings not forming part of the mask pattern would remain closed. However, at very high circuit densities, such a repair process would be highly time consuming. Therefore, the approach according to the present invention is such that not all photoresist regions overlying desired mask holes are reexposed, but only those overlying defect holes, thus considerably reducing mask repair times.

The exposure system, into which the mask to be repaired is introduced, directs the exposure electron beam onto the very mask region to be exposed, whose data (position coordinates) have been stored in the preceding inspection step. After comparison of these data with the structural data of the desired mask openings, the exposure system writes a pattern, corresponding to the size of the respective defect holes overlaying the mask region to be repaired. For electron beam exposure, the beam dose must be chosen as a function of the photoresist to be exposed, such that the latter is cross-linked, thus becoming insoluble. With the negative photoresists currently available that dose typically ranges from about 50 to 80 $\mu C/cm^2$. For positive photoresists it typically has to be increased to about three times that value to about 150 to 300 $\mu C/cm^2$ to ensure that the photoresist overlying the defect hole is strongly cross-linked during exposure, thus becoming insoluble. In the case of a blanket positive photoresist, this step is followed by blanket exposure, which can be done using photooptical radiation, such as UV light, permitting the photoresist to be removed by a conventional developer for photoresist materials from any regions not be repaired. With negative resist materials where non-exposed resist regions are developed, i.e., removed, by an organic solvent, the previously described exposure step is eliminated. In the preferred embodiment of the present invention, after all defect holes of the transmission mask have been closed, gold is vapor-deposited on the latter from the rear, with the remaining, cross-linked regions of the photoresist layer acting as a substrate. The thickness of the gold layer is that necessary for decelerating exposure radiation, such as electron beam, used during subsequent lithography processes. Subsequently, these photoresist regions are removed in an oxygen plasma, removal being the preferred embodiment.

FIGS. 2 through 5 will be described briefly below. FIG. 2A shows a transmission mask with patterned openings. FIG. 2B shows the same transmission mask but with two strips of cross-linked photoresist extending across each single mask opening. These strips are obtained by exposing the photoresist overlying the mask hole opening in a stripe pattern. FIG. 3A shows a transmission mask exhibiting numerous pattern openings. FIG. 3B shows the same mask, whose surface is blanket-coated with photoresist. FIG. 3C shows the mask with a single opening which has been reopened, from which a dust particle is to be removed, on the left side. FIG. 3D shows a magnified version of the opening with the dust particle to be removed.

Figure 4A:
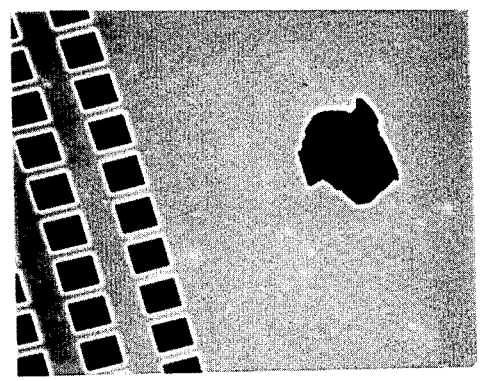
FIG. 4A shows a transmission mask with a defect hole outside the actual mask pattern.
Figure 4B:
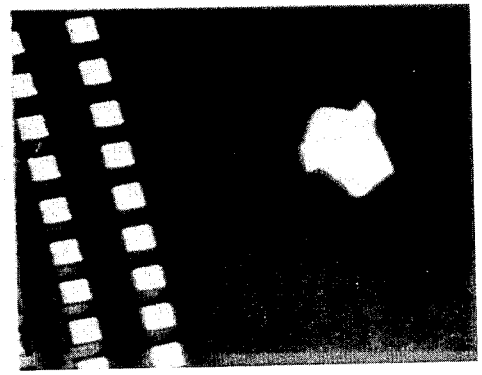
FIG. 4B shows the same mask blanket-coated with photoresist.
Figure 4C:
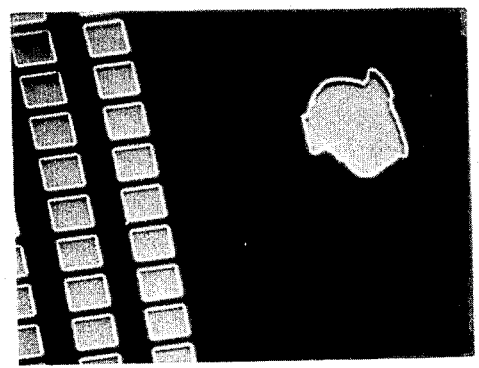
FIG. 4C shows the same mask after removal of the photoresist, with a self-supporting gold layer in the region of the openings and defect hole.

FIG. 4A shows a transmission mask with a defect hole outside the actual mask pattern. FIG. 4B shows the same mask blanket-coated with photoresist and FIG. 4C again the same mask after removal of the photoresist but with a self-supporting gold layer in the hole region.

Figure 5A:
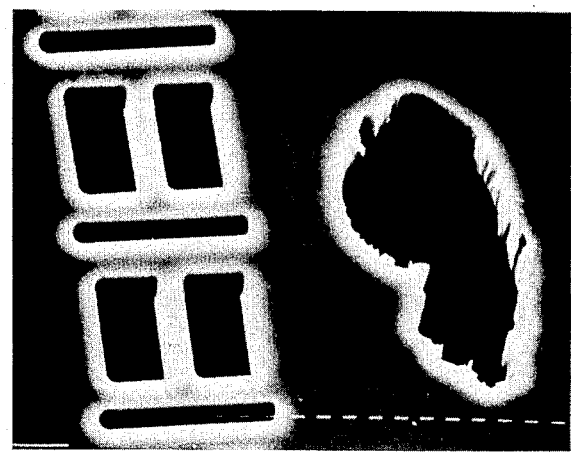
FIG. 5A is a sectional view of a transmission mask with a defect hole.
Figure 5B:
FIG. 5B shows the defect hole (FIG. 5A) closed with a gold layer.

FIG. 5A is a sectional view of a further transmission mask with a defect hole repaired by the described method and sealed with a gold layer (FIG. 5B).

EXAMPLE

In one embodiment which utilizes a positive tone photoresist, a mask to be repaired is covered with an about 0.5 to 2 $\mu m$ thick positive tone photoresist layer using standard spin coating techniques. Suitable positive tone photoresist materials are, for instance, AZ 1450J or AZ 1350J by Shipley Company, Inc. which are comprised of a novolak resin and a diazoquinone derivative sensitizer, or a polymethylmethacrylatebased resists. The positive resist layer is then exposed using electron beam radiation at a high electron dose, for example, about 200 $\mu C/cm^2$ according to the structural and inspection data of the mask stored in the exposure system. Subsequent to the patterned exposure, blanket exposure, using radiation capable of rendering the non-cross-linked photoresist soluble in common developers, is effected upon the positive resist layer. This radiation can be comprised of electron beam radiation at a low electron dose, for example, about 50 $\mu C/cm^2$ or can be typical optical radiation as is well known in the art for positive photoresists. The regions of the photoresist layer that have been exposed only once are removed, using a commercially available developer solution, so that only the resist regions that have been exposed twice and that are cross-linked remain above the transmission mask regions to be corrected. Subsequently, gold is vapor-deposited on the mask from the rear, with the remaining resist layer acting as a substrate. Then the remaining resist is removed in an oxygen plasma. This method yields a transmission mask in which all undesired holes are closed with gold and all defective holes have been repaired to their desired dimensions.

In addition to electron beam exposure systems, the method of the present invention is suitable for use with systems wherein exposure is accomplished using ion beams, X-rays, lasers or UV radiation. The advantage of the described mask repair method, wherein the photoresist layer overlying the region to be repaired is directly approached by the exposure system in response to a comparison of data, is that mask repairs are possible within milliseconds.

Only a limited number of the potential embodiments of the invention have been described above, and one skilled in the art will recognize that numerous substitutions, modifications, and alterations are permissible without departing from the spirit and scope of the invention, demonstrated in the following claims.

We claim:

1. A method for repairing transmission lithographic masks using desired mask pattern position coordinates and inspected mask pattern position coordinates comprising the steps of:
   (a) inspecting a mask for mask defects and obtaining defect position coordinates, said defect position coordinates being determined by comparison of the desired mask pattern position coordinates stored in computer data records with the inspected mask pattern position coordinates wherein the mask inspection is accomplished using an electron raster microscope or an electron beam scanner (vector scanner) or an electron beam projection system;
   (b) storing the defect position coordinates in computer data records,
   (c) coating a first major side of the defective mask with a photoresist,
   (d) exposing the photoresist to radiation selected from the group consisting of e-beam, ion beam or x-ray which crosslinks the photoresist in appropriate regions corresponding to the defect position coordinates stored in computer data records relative to at least one defect where no operator intervention is required; and
   (e) removing the photoresist regions not crosslinked, wherein mask repairs are made within milliseconds.

2. The method of claim 1, wherein the first major side of the mask is coated with a negative tone photoresist.

3. The method of claim 2, wherein the radiation used for exposure is electron beam radiation at a dose ranging from about 50 to 80 $\mu C/cm^2$.

4. The method of claim 1, wherein the first major side of the mask is coated with a positive photoresist.

5. The method of claim 4, wherein the radiation used for exposure is electron beam radiation at a dose ranging from about 150 to about 300 $\mu C/cm^2$.

6. The method of claim 5 wherein subsequent to step (d) and prior to step (e), the photoresist is blanket exposed to radiation which renders non-crosslinked areas of the photoresist soluble in commonly available developers.

7. The method of claim 6, wherein the blanket radiation is photooptical radiation.

8. The method of claim 1, wherein a frayed mask opening is corrected.

9. The method of claim 8, wherein the photoresist overlaying the desired mask opening is not exposed and the photoresist adjacent to the desired mask opening is exposed, to provide crosslinked photoresist in the frayed areas adjacent to the desired mask opening.

10. The method according to claim 1, including the additional step:
    (f) applying gold to a second major side of the defective mask so that the cross-linked photoresist of step (d) serves as a substrate for at least a portion of the gold applied.

11. The method of claim 10, wherein the gold is vapor deposited.

12. The method according to claim 10, including the additional steps:
    (g) removing the crosslinked photoresist regions.

13. The method of claim 12, wherein the crosslinked photoresist is removed using a dry etch step.

14. A method for repairing lithographic masks using desired mask pattern position coordinates and inspected mask pattern position coordinates comprising the steps of:
    (a) using an electron beam system to inspect said mask for mask defects and obtaining defect position coordinates, said defect position coordinates being determined by comparison of the desired mask pattern position coordinates with the inspected mask pattern position coordinates;
    (b) coating a first major side of the defective mask with a photoresist;
    (c) using the same electron beam system to expose the photoresist to radiation which crosslinks the photoresist in appropriate regions corresponding to the defect position coordinates relative to at least one defect; and
    (d) removing the photoresist regions not crosslinked.

* * * * *